United States Patent [19]

Betts

[11] Patent Number: 4,906,835

[45] Date of Patent: Mar. 6, 1990

[54] LIGHT SENSING AND EMITTING DEVICES WITH A SAFELIGHT

[75] Inventor: Peter J. Betts, Chelmsford, United Kingdom

[73] Assignee: The General Electric Company, p.l.c., Chelmsford, United Kingdom

[21] Appl. No.: 226,116

[22] Filed: Jul. 29, 1988

[30] Foreign Application Priority Data

Jul. 29, 1987 [GB] United Kingdom ................. 8718007

[51] Int. Cl.$^4$ .............................................. G01J 3/50
[52] U.S. Cl. .................................... 250/226; 356/443
[58] Field of Search .......................... 250/226, 211 R; 354/298, 307; 356/443; 362/800, 803

[56] References Cited

U.S. PATENT DOCUMENTS 4,199,252  4/1980  Vermeulen .......................... 356/443
4,673,807  6/1987  Kobayashi et al. .................. 356/443
4,804,833  2/1989  Matsubara ........................ 250/211 J

OTHER PUBLICATIONS

"Solid State Dark Room Lighting", from *Elektor* (GB) vol. 9, No. 10, Oct. 1983 (pp. 36–37).
"LED Flashlight", *Research Disclosure No.* 19107 (Mar. 1980), pp. 105–106.

*Primary Examiner*—David C. Nelms
*Attorney, Agent, or Firm*—Lowe, Price, LeBlanc, Becker & Shur

[57] ABSTRACT

A light sensor for use to detect only light above a given frequency uses as its light sensitive element a light emitting diode. The L.E.D. is one which, if it were arranged to emit light, would emit light having a maximum frequency equal to the said given frequency.

In combination with such a sensor another L.E.D. can be used having a maximum emission frequency below the said given frequency to illuminate an area without affecting the light sensor.

6 Claims, 3 Drawing Sheets

LIGHT SENSING AND EMITTING DEVICES WITH A SAFELIGHT

FIELD OF INVENTION

This invention relates to instruments for sensing or emitting light in one range of frequencies while not sensing or emitting light in another range of frequencies.

One situation in which such instruments are needed is in a photographic darkroom. In a darkroom it is necessary to measure the brightness and contrast of a projected image in order to select the appropriate paper grade and exposure time. However in order to allow the operator to see what he is doing the darkroom must be lit by a light source, known as a safe light, which emits light only in a range of wavelengths to which photographic paper is insensitive but which the human eye can see. This produces the problem that a light meter will respond to the light from the safe light as well as the light from the projected image that it is supposed to sense.

DESCRIPTION OF THE PRIOR ART

One known method of overcoming such a problem is to use a filter element on the safelight that allows the emission of only one band of wavelengths and a filter element on the light meter that excludes the band of wavelengths emited by the safelight, which the light meter is of course to ignore.

However such filters are difficult to provide because they must block substantially all the light in one band of wavelengths and have a very sharp cut off in wavelength, otherwise a sufficiently large variation in intensity of the light emitted from the safelight will produce a response from the light meter, albeit a very small response compared to the responses produced by light from the image at wavelengths passed by the light meter filter. Filters capable of doing this are generally expensive and often the intensity of light passed at wavelengths the filter is not intended to block will be unacceptably reduced.

Another problem is that the filter on the safelight will generally absorb a large proportion of the energy given out by the safelights lighting element, this results in an expensive waste of energy and the amount of heat dissipated by the filter can be such that over a period of time the filter performance will be significantly degraded by heat damage.

BRIEF SUMMARY OF THE INVENTION

The invention provides a light sensing instrument for use in an environment containing background illumination at a range of wavelengths having a minimum wavelength, including a light emitting diode arranged to operate as a light sensor and therefore being sensitive only to light at or below a certain wavelength, the diode being such that this wavelength is below the minimum wavelength of the background radiation.

This invention also provides a light source for use in a photograhic dark room and comprising a light emitting diode and thus emitting light at and above a specific wavelength.

An array of light emitting diodes can be used as a light source. Light emitting diodes emit light by electrons in the diode changing from a first "unbound", relatively high energy state to a second "bound", relatively low energy state, a photon being emitted having energy equal to the energy lost by the electron. The energy levels available to the electrons, and thus the possible energies of the emitted photons are determined by the physical dimensions and materials of the diode. There is no lower limit on the mount of energy that each emitted photon has, but there is an upper limit on how much energy each emitted photon can have. Thus there is a lower limit on the wavelength of light produced by the L.E.D.

Such an L.E.D. based light, since it does not require a filter, will be more efficient than a conventional safelight and so it will require less power. Additionally the problem of excessive heating of a filter will not arrise because there is no filter.

A light emitting diode can be arranged to operate as a light sensor by connecting it unbiased across the input terminals of an amplifier. When light is incident on the L.E.D.'s p-n junction each photon will give its energy to an electron. If this energy is large enough it will raise the electron from a "bound" state in which it is immobile to an "unbound" state in which it is mobile. The mobile electrons will then move producing a voltage across the L.E.D., this voltage will be proportional to the logarithm of the intensity of the light incident on the p-n junction. The voltage produced across the L.E.D. will then be picked up and amplified by the amplifier.

If a photon has insufficient energy to raise an electron to such an unbound state it will not produce any voltage. The wavelength of light comprising photons whos energy will just be sufficient to raise an electron from bound state to an unbound state is the same as the shortest emitting wavelength of the L.E.D. The shortest emitting wavelength of an L.E.D. is the shortest wavelength at which the L.E.D. will emit light when a current is passed through it. Thus it follows that light at wavelengths longer than this emission wavelength will not be sensed.

The logarithmic response of the L.E.D. to light intensity is useful because the response of photographic paper is generally proportional to the logarithm of the intensity of incident light.

BRIEF DESCRIPTION OF SEVERAL VIEWS OF THE DRAWINGS

A light sensor and a light source embodying the invention will now be described with reference to the accompanying Figures in which.

DETAILED DESCRIPTION

Figure 1:
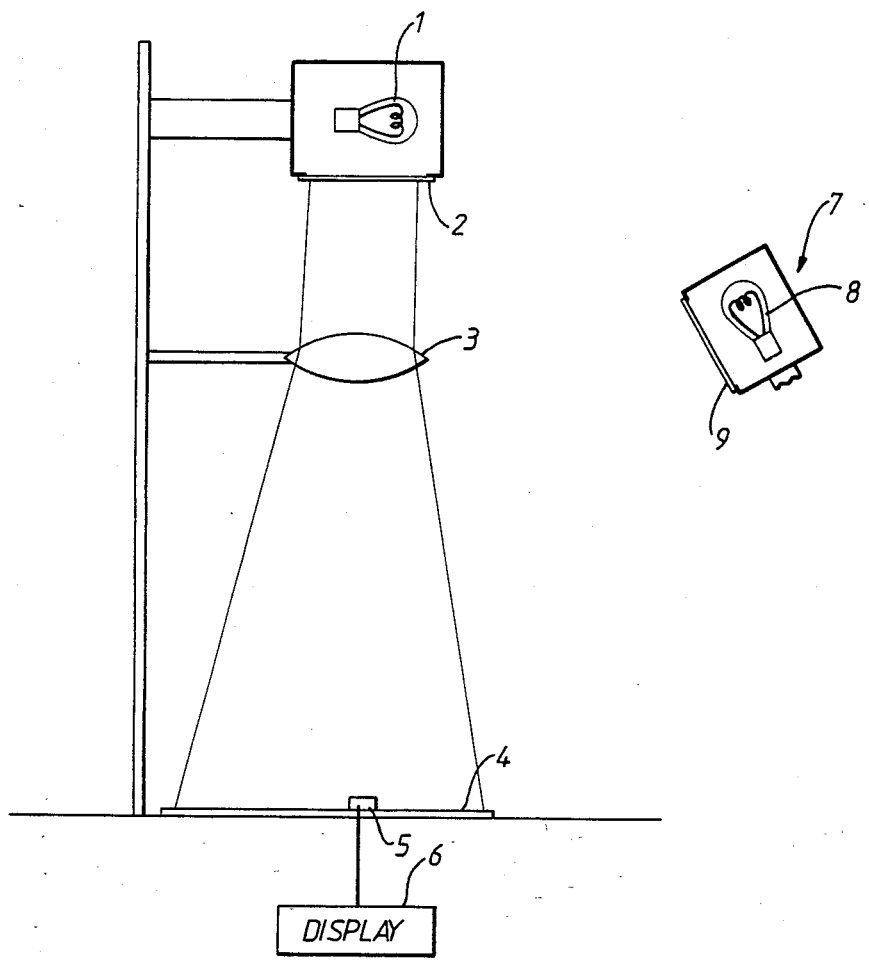
FIG. 1 shows a photographic enlarger employing the invention in schematic form.

Refering to FIG. 1 a photographic enlarger consist of a white light source 1 mounted behind a photographic negative 2. The light passing through the negative 2 goes into an optical system represented by the lens 3 which focusses it on the masking frame 4 of the enlarger.

An optical sensor 5 is moved about the image formed on the frame 4 by hand. It continually measures the intensity of the light falling on it and calculates the contrast range of the image formed on the masking frame 4, this information is then shown on the display 6 in order to allow the operator to select the most suitable grade of photographic paper.

The entire area is illuminated by a light source 7, emitting all its light in a set band of wavelengths represented here by a light source 8 behind a band pass filter 9. This light source 7 emits the red and infra-red bands of wavelengths and although the red wavelengths are visible to the human eye and enable the operator to see, they and the infra-red wavelengths have no effect on photographic paper, or on the optical sensor 5.

Figure 2:
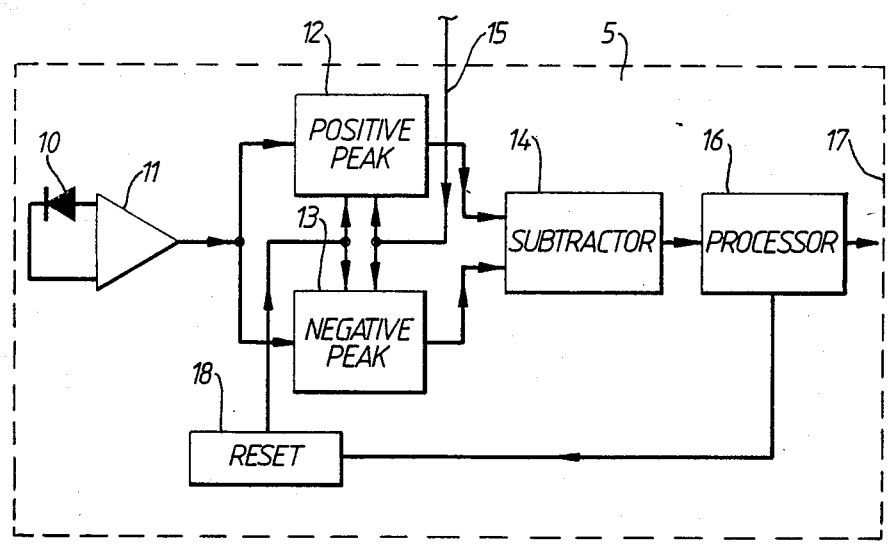
FIG. 2 shows electrical circuits in the apparatus of FIG. 1 in more detail, in block-diagram form.

Refering to FIG. 2 the optical sensor 5 has as its light sensitive element a light emitting diode (L.E.D.) 10. This L.E.D. 10 is one which would, when arranged to emit light, emit green light. Because the L.E.D. 10 is a green light emitting L.E.D., photons of light at wavelengths longer than that of green light have insufficient energy to raise its electrons to the conductive band, and so the red and infra-red light from the safelight 7 has no effect on the L.E.D. 10.

Signals produced by the L.E.D. 10 are amplified by an amplifier 11 and then supplied to a positive peak detector 12 and a negative peak detector 13. The positive peak detector 12 detects and then holds the highest signal level produced by the amplifier 11. Similarly the negative peak detector 13 detects and then holds the lowest signal level produced by the amplifier 11.

The two signals held in the peak detectors 12 and 13 are supplied to a subtractor circuit 14 on receipt of a signal along a line 15. The signal on line 15 is produced by the operator pressing a button when he feels that a sufficient amount of measurement of light intensity has been carried out to allow the contrast range of the image to be calculated. The subtractor circuit 14 produces a difference signal which is supplied to a processor 16. The processor 16 uses the difference signal to calculate what grade of paper is required and sends this information along a line 17 to be displayed to the operator on the display 6. Simultaneously a signal is sent to a reset 18 which resets the positive peak register 12 to zero and resets the negative peak register to its highest possible value in order to be ready for the next measurement.

Figure 3:
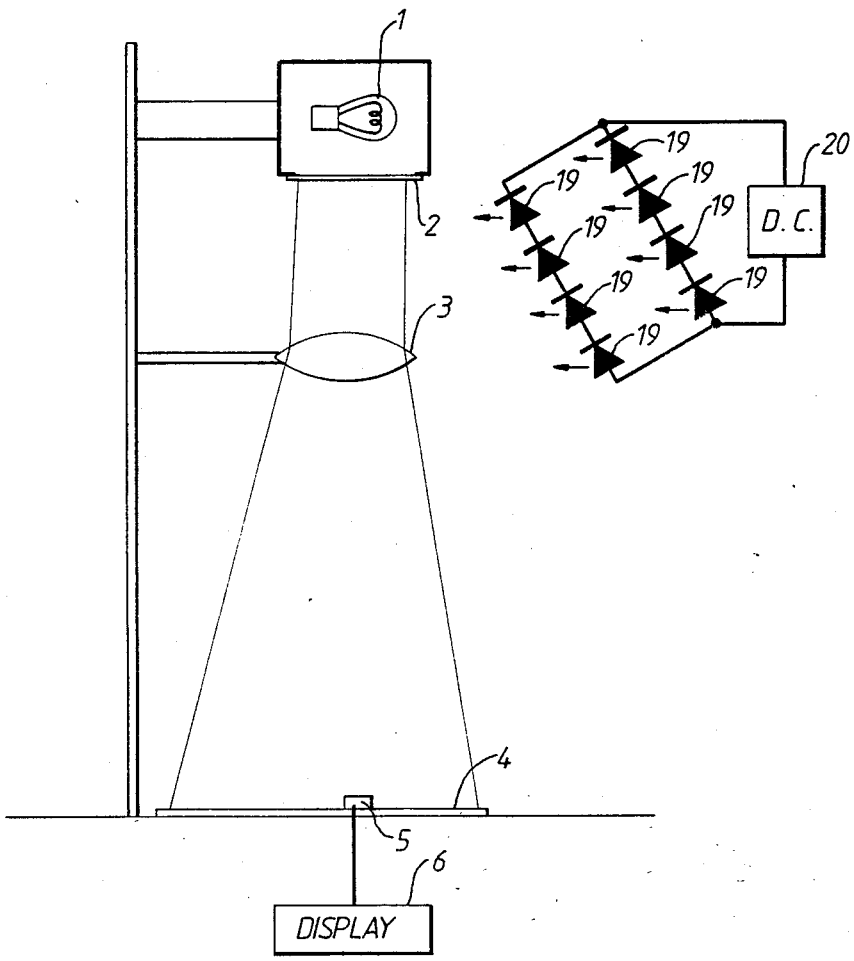
FIG. 3 shows a light source employing the invention in conjunction with a photographic enlarger employing the invention in schematic form, the same reference numerals being used for identical parts throughout.

Refering to FIG. 3 a photographic enlarger is employed as in FIG. 1. The safe light is formed by an array of light emitting diodes 19. The light emitting diodes 19 are supplied with current by a D.C. power source 20.

The L.E.D.'s 19 all emit red light which is easily visible to people working in the darkroom and does not affect photographic paper but comprises of photons having insufficient energy to affect the L.E.D. 10 in the light sensor 5.

Although eight L.E.D.'s are present in the array shown the actual number of L.E.D.'s used in practice will depend on the amount of illumination needed.

Although the L.E.D.'s 19 are shown as being powered from a D.C. power source it would be possible to power them from an A.C. source and even directly from the A.C. mains supply if there were a large number of L.E.D.'s in the array.

I claim:

1. A combination comprising: a light sensing instrument and a safelight operative to emit light in a range of wavelengths having a minimum wavelength, said instrument including a light emitting diode arranged to operate as a light sensor and being sensitive only to light at or below a certain wavelength, said diode being such that this wavelength is below said minimum wavelength.

2. The combination as claimed in claim 1 wherein the safelight comprises at least one light emitting diode operative to emit light only above a specific wavelength, said light sensing instrument being sensitive only to light at and below said specific wavelength.

3. The combination as claimed in claim 2 comprising a plurality of light emitting diodes all emitting light above the specific wavelength.

4. A method for using a light sensing instrument in a photographic darkroom comprising providing safelight background illumination at a range of wavelengths having a minimum wavelength, said instrument including a light emitting diode arranged to operate as a light sensor and being sensitive only to light at or below a certain wavelength, the diode being such that this wavelength is below the minimum wavelength of the safelight background radiation, sensing light with said instrument without sensing light from said safelight.

5. A method as claimed in claim 1 wherein the safelight comprises at least one light emitting diode and which emits light only above a specific wavelength, the light sensing instrument being sensitive only to light at and below said specific wavelength.

6. A method as claimed in claim 2 comprising providing a plurality of light emitting diodes all emitting light above the specific wavelength.

* * * * *